United States Patent
Nihei et al.

(10) Patent No.: US 8,198,113 B2
(45) Date of Patent: Jun. 12, 2012

(54) PRODUCTION METHOD FOR SEMICONDUCTOR LIGHT EMITTING DEVICES

(75) Inventors: Noriko Nihei, Sagamihara (JP); Yusuke Yokobayashi, Yokohama (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/041,553

(22) Filed: Mar. 7, 2011

(65) Prior Publication Data

US 2011/0217803 A1   Sep. 8, 2011

(30) Foreign Application Priority Data

Mar. 8, 2010   (JP) ................. 2010-050057

(51) Int. Cl.
H01L 21/00   (2006.01)

(52) U.S. Cl. ............... 438/46; 438/458; 257/E21.475

(58) Field of Classification Search ........... 438/590; 257/E21.097, E21.098, E21.4, E21.441, E21.471, 257/E21.475, E21.477, E21.532
See application file for complete search history.

(56) References Cited

U.S. PATENT DOCUMENTS

| | | | |
|---|---|---|---|
| 2003/0150843 A1* | 8/2003 | Doi et al. | 219/121.6 |
| 2006/0003553 A1* | 1/2006 | Park et al. | 438/462 |
| 2010/0258818 A1* | 10/2010 | Lee et al. | 257/79 |
| 2011/0104835 A1 | 5/2011 | Nihei et al. | |

FOREIGN PATENT DOCUMENTS

| | | |
|---|---|---|
| JP | 2003-168820 A | 6/2003 |
| JP | 2006-073619 A | 3/2006 |
| JP | 2011-100767 A | 5/2011 |

* cited by examiner

*Primary Examiner* — Cheung Lee
(74) *Attorney, Agent, or Firm* — Holtz, Holtz, Goodman & Chick, PC

(57) ABSTRACT

Producing a semiconductor film containing a first semiconductor layer, an active layer, and a second semiconductor layer, each represented as $Al_xIn_yGa_zN$, on a growth substrate, the layers arranged in this order from the growth substrate side. Producing a metal layer on the semiconductor film and/or a support and joining the semiconductor film and the support with the metal layer sandwiched between them. Irradiating the peripheral region of the growth substrate with a laser beam to separate the growth substrate from the semiconductor film in the peripheral region. Irradiating portions on the inner side of the peripheral region of the growth substrate with a laser beam, while leaving unirradiated portions, to separate and remove the growth substrate from the semiconductor film. Removing some portions of the semiconductor film where the growth substrate has already been separated and removed, to set up regions where semiconductor light emitting devices are to be produced.

6 Claims, 12 Drawing Sheets

UV-impermeable Sheet $Q_6$ — Peripheral Region (laser-irradiated region) $Q_5$ — Direction of Laser Scanning

Laser $Q_7$ — Laser $Q_7$ — UV-impermeable Sheet $Q_6$ — 10, 20, 30, 40 — Adhesive Sheet $Q_8$

$Q_{10}$ : Unreacted Portion 20 $\mu$m

PRODUCTION METHOD FOR SEMICONDUCTOR LIGHT EMITTING DEVICES

CROSS-REFERENCE TO RELATED APPLICATION

This application is based upon and claims the benefit of priority of the prior Japanese Patent Application No. JP 2010-050057, filed on Mar. 8, 2010, the entire contents of which are incorporated herein by reference.

BACKGROUND OF THE INVENTION

A) Field of the Invention

The invention relates to a method to produce semiconductor light emitting devices.

B) Description of the Related Art

In the field of semiconductor light emitting devices, particularly those composed mainly of a Group-III nitride-based blue light emitting semiconductor that are represented as $Al_xIn_yGa_zN$ ($0 \leq x \leq 1$, $0 \leq y \leq 1$, $0 \leq z \leq 1$, $x+y+z=1$), there is recently a wider use of so-called vertical type semiconductor light emitting devices in which the growth substrate used for crystal growth of a semiconductor film has been removed and the electric current is caused to flow in the vertical direction.

A heterogeneous substrate such as a sapphire substrate that is low in price, high in lattice matching capability with $Al_xIn_yGa_zN$, and useful for crystal growth of a high quality semiconductor film is commonly used as said growth substrate. However, sapphire is lower in refractive index for blue light than the semiconductor film. Accordingly, part of the blue light generated in the active layer in the semiconductor film is totally reflected back into the active layer, limiting the amount of light that is released out. A vertical type semiconductor light emitting device is free from a growth substrate to solve the problem with total reflection arising from the difference in refractive index and able to have a high light extraction efficiency.

In a vertical type semiconductor light emitting device, the support can be used as p-electrode, and therefore, it is not necessary to remove part of the semiconductor film that contains an active layer and to form n-electrodes and p-electrodes on the same face of a semiconductor film as in the case of a horizontal type semiconductor light emitting device. Thus, only n-electrodes exist on the light emitting side, making it possible to increase the light emitting area (active layer area) in a semiconductor light emitting device. Accordingly, the area shaded by the electrodes can be decreased.

Figure 11A:
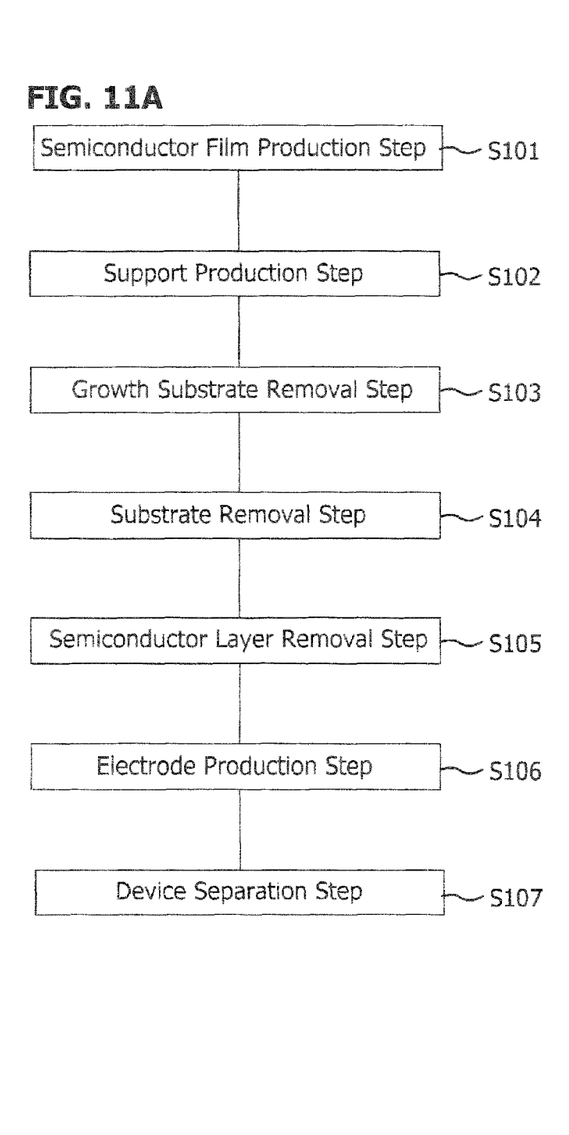
FIG. 11A to 11D describe a common production method for vertical type semiconductor light emitting devices.

A typical process to produce a vertical type semiconductor light emitting device is described below with reference to FIG. 11A to 11D. FIG. 11A shows a flow chart for the production of a vertical type semiconductor light emitting device. A growth substrate, such as a sapphire substrate, is prepared, and crystal of $Al_xIn_yGa_zN$ is grown to form a semiconductor film (step S101). MOCVD (metal organic chemical vapor deposition), for instance, is used to carry out the crystal growth for semiconductor film production. The semiconductor film formed should consist at least of a first semiconductor layer of a first electrical conduction type (n-type), an active layer that emits light, and a second semiconductor layer of a second electrical conduction type (p-type), arranged in this order from the growth substrate side.

Electron beam deposition, for instance, may be carried out to produce a metal layer on a semiconductor film surface (a metal multi-layered film to constitute p-electrodes and a joining layer), and the semiconductor film and the support are joined together with the metal layer sandwiched between them (step S102). The support is an electrically conductive substrate in the form of, for instance, a silicon wafer containing impurities or a plate made of or plated with a metal such as Cu and CuW or their alloy. This joining is commonly carried out by thermocompression bonding.

The growth substrate, such as sapphire substrate, is peeled and removed by the laser lift-off technique (step S103). A laser beam is applied from the growth substrate side so that some portions of the semiconductor layer of, for instance, GaN existing near the interface between the growth substrate and the semiconductor film are decomposed into Ga (metal) and $N_2$ (gas). For instance, the entire face of the wafer is scanned by a linearly shaped laser beam to peel the growth substrate (see, for instance, Japanese Unexamined Patent Publication (Kokai) No. 2003-168820 as Patent document 1, and Japanese Unexamined Patent Publication (Kokai) No. 2006-073619 as Patent document 2).

In their previous application (Application Filing No. 2009-252902 as Patent document 3), the present inventors proposed a growth substrate peeling method in which the wafer is divided into regions, each planned to contain a semiconductor light emitting device, and laser beam pulses of a rectangular shape slightly larger than the regions are applied to each region.

Figure 11B:
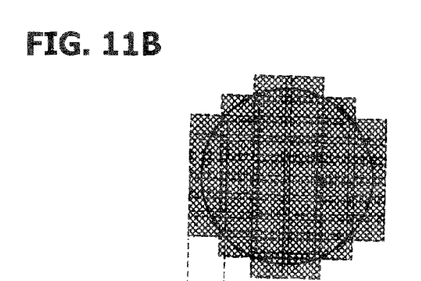
Figure 11C:
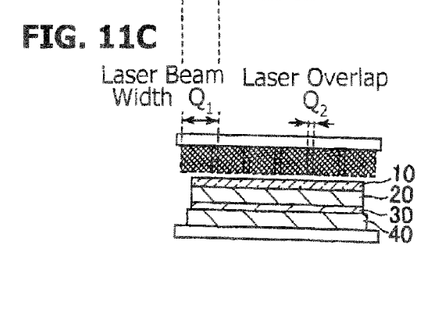

FIG. 11B and FIG. 11C show a plan view and a cross section of a pulsed laser beam irradiation region in the growth substrate removal step (step S103). It contains a semiconductor film 20, a metal layer (p-electrodes and joining layer) 30, and a support 40 produced in this order on a growth substrate 10 in the semiconductor film production step (step S101) and the support production step (step S102). A pulsed laser beam, such as KrF excimer laser with a wavelength of 248 nm, is applied from the growth substrate side. The energy density may be, for instance, 920 mJ/cm$^2$ at the beam-irradiated surface.

As shown in FIG. 11B, a rectangle shaped laser pulse beam is applied to scan them, for instance, in their short side direction (vertical direction in the figure) or in their long side direction (horizontal direction in the figure). When scanning the wafer, beam irradiated regions should overlap each other at their edges to prevent unirradiated regions from being left on wafer.

See FIG. 11C. The laser pulse used to irradiate wafer has a long side (laser beam width $Q_1$) of, for instance, 540 μm and an overlap width $Q_2$ of, for instance, 10 μm.

Figure 11D:
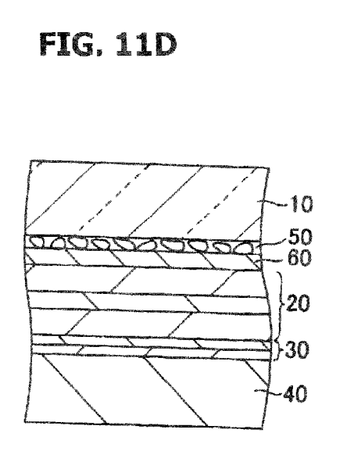

Subsequently, a process for removal of the growth substrate is carried out (step S104). FIG. 11D schematically shows a cross section of the laminated structure, which contains the semiconductor film 20, immediately after laser beam irradiation. The growth substrate 10 and the semiconductor film 20 are still joined together, sandwiching a metal Ga layer 50 separated out as a result of the decomposition of GaN caused by laser beam irradiation and the altered layer 60 which is part of the semiconductor film 20 altered by laser beam irradiation. The growth substrate 10 is removed by immersing the wafer in warm water of above 30° C., which is the melting point of Ga. The wafer may be immersed in HCl to dissolve Ga.

The semiconductor film 20 is removed in those portions existing between semiconductor light emitting devices (step S105) to produce grooves (streets) that isolate individual semiconductor light emitting device regions. Said removal of the semiconductor film 20 may be carried out by wet etching with an alkali solution such as TMAH (tetramethylammonium hydroxide) and KOH or dry etching such as RIE (reactive ion etching).

Then, n-electrodes are produced on the surface of the semiconductor film 20 (first semiconductor layer) exposed by removing the growth substrate 10 (step S106). In the Patent document 2, for instance, Au and Ti layers are laminated to produce n-electrodes.

The devices are separated (step S107). The metal layer 30 and the support 40 are cut along the streets produced in the semiconductor film 20 removal step (step S105) to separate individual semiconductor light emitting devices. Such methods as scribing/breaking, laser scribing, and dicing are used for the cutting operation.

The vertical type semiconductor light emitting device production method described above requires a substrate removal step (step S104) to be carried out after laser beam irradiation. Here, if said warm water or HCl cannot enter gaps, the growth substrate 10 will not be removed by the immersion in warm water or HCl in this step. If the altered layer 60 exists, furthermore, surface treatment such as mechanical polishing and dry etching with RIE will be required after removing the growth substrate 10.

Figure 12A:
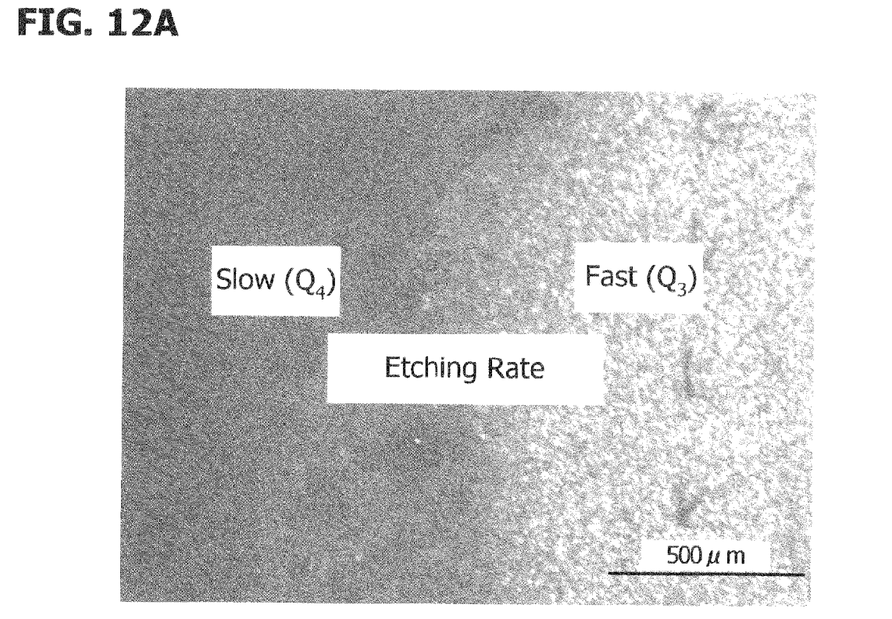
FIG. 12A shows a photograph that illustrates irregular etching resulting from differences in surface conditions after peeling off the growth substrate 10.

The Ga layer 50 and the altered layer 60 that are produced by laser beam irradiation will not react with the etchant used for the semiconductor film 20 remove step (step S105), or they may show an etching rate different from that of the semiconductor film 20. In addition, the thickness of the metal Ga layer 50 (amount of the metal Ga separated out) and that of the altered layer 60 tend to be influenced by the warp of the wafer and the heat dissipation form the equipment, and they will be less uniform in the wafer as the energy of laser beam irradiation varies. If the semiconductor film 20 removal step (step S105) is carried out under such conditions, the degree of etching of the semiconductor film 20 will become irregular along the streets. As a result, residue of the semiconductor film remaining on the streets may cause inferior scribing or attach to the side face of the semiconductor light emitting device production regions to cause leak in later steps, resulting in a decrease in the yield. FIG. 12A gives a photograph that shows such irregular etching resulting from differences in surface conditions after the peeling of the growth substrate 10. $Q_3$ and $Q_4$ denote portions where the etching speed is higher and lower, respectively.

Figure 12B:
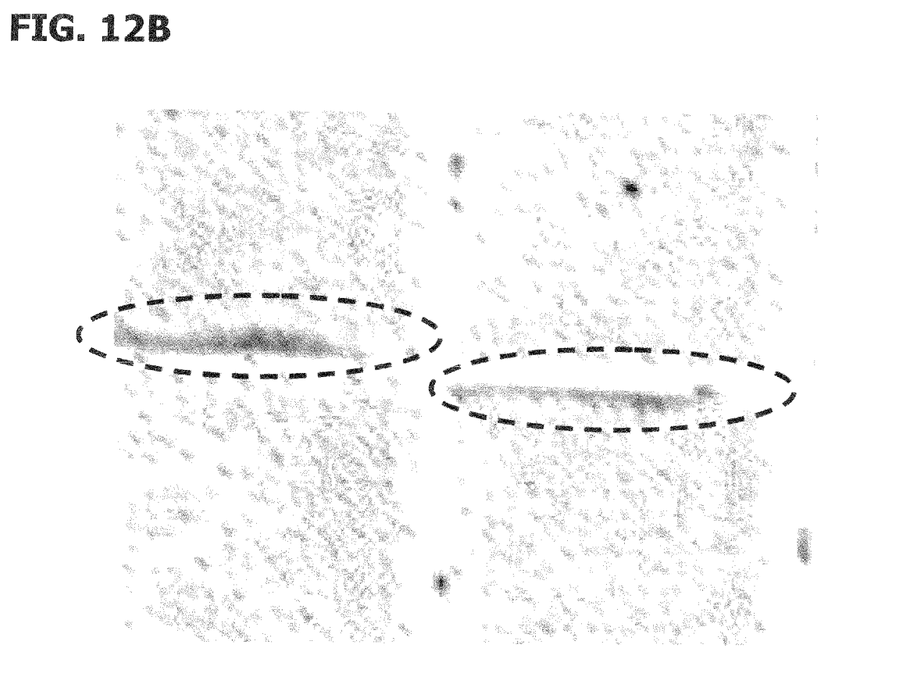
FIG. 12B shows a photograph that illustrates cracks resulting from multiple irradiation of a laser beam.

In some tests where the growth substrate 10 removal step (step S103) was carried out by the laser lift-off technique, it was found difficult to peel off peripheral portions of the wafer and remove the growth substrate 10 by laser beam irradiation. As the energy of laser beam irradiation for its removal was increased, the semiconductor film 20 was destroyed sometimes, and cracks took place in some semiconductor light emitting device production regions. In other cases, the semiconductor film 20 suffered cracks starting from portions between semiconductor light emitting device production regions (center of streets) where laser beam irradiation overlaps (multiple irradiation). FIG. 12B gives a photograph showing cracks that took place in multiple laser irradiated regions. In the photograph, cracks are surrounded by broken lines.

SUMMARY OF THE INVENTION

The invention aims to provide a high-efficiency production method for semiconductor light emitting devices.

An aspect of the invention provides a semiconductor light emitting device production method comprising:
(a) a step of preparing a growth substrate, (b) a step of producing a semiconductor film containing a first semiconductor layer of a first electrical conduct on type, an active layer, and a second semiconductor layer of a second electrical conduction type, each represented as $Al_xIn_yGa_zN$ ($0 \leq x \leq 1$, $0 \leq y \leq 1$, $0 \leq z \leq 1$, $x+y+z=1$), on the growth substrate, the layers arranged in this order from the growth substrate side, (c) a step of preparing a support, (d) a step of producing a metal layer on the semiconductor film and/or the support and joining the semiconductor film and the support with the metal layer sandwiched between them, (e) a step of irradiating the peripheral region of the growth substrate with a laser beam to separate the growth substrate from the semiconductor film in the peripheral region, (f) irradiating portions on the inner side of the peripheral region of the growth substrate with a laser beam, while leaving unirradiated portions, to separate and remove the growth substrate from the semiconductor film, and (g) a step of removing some portions of the semiconductor film where the growth substrate has already been separated and removed, to set up regions where semiconductor light emitting devices are to be produced.

The invention can provide a high-efficiency production method for semiconductor light emitting devices.

DESCRIPTION OF EMBODIMENTS

Figure 1:
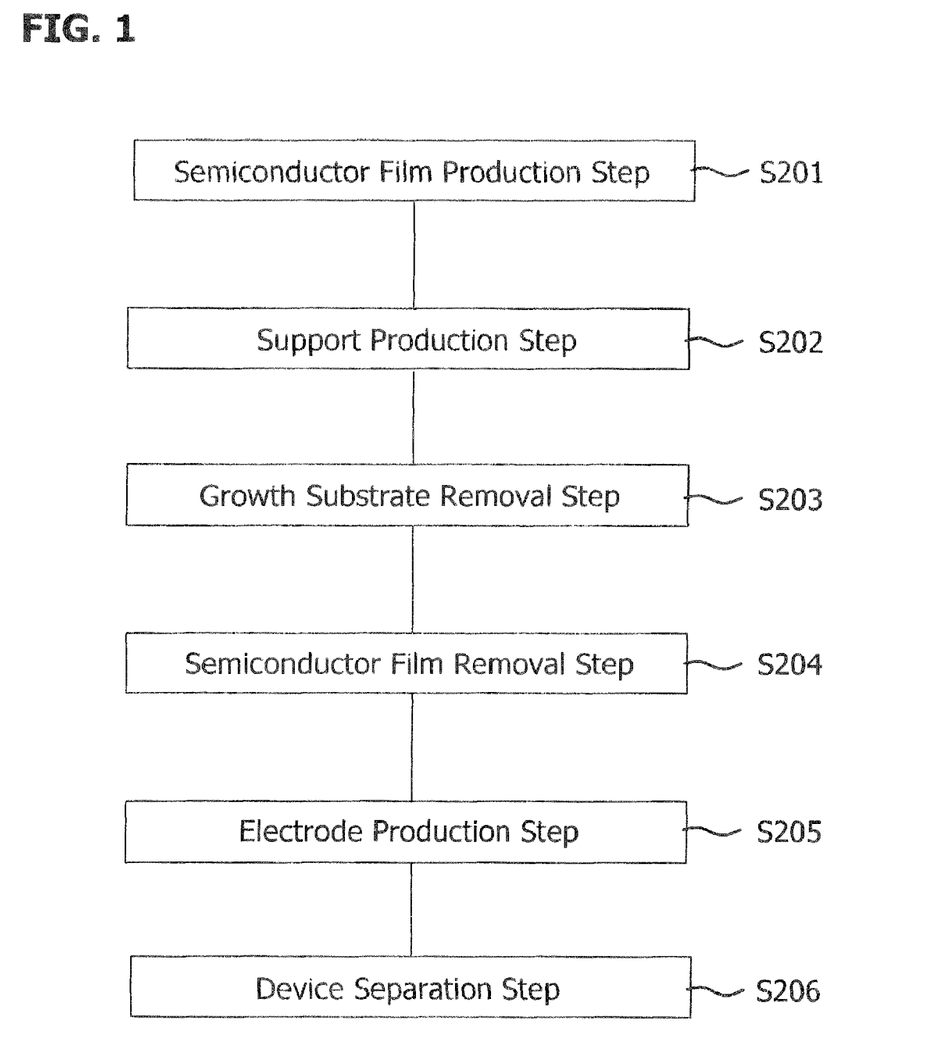
FIG. 1 shows a flow chart of the semiconductor light emitting device production method of the Embodiment.

FIG. 1 shows a flow chart of the semiconductor light emitting device production method of the Embodiment. The semiconductor light emitting device production method of the Embodiment contains a semiconductor film production step (step S201), a support production step (step S202), a growth substrate removal step (step S203), a semiconductor film removal step (step S204), an electrode production step (step S205), and a device separation step (step S206).

Figure 2A:
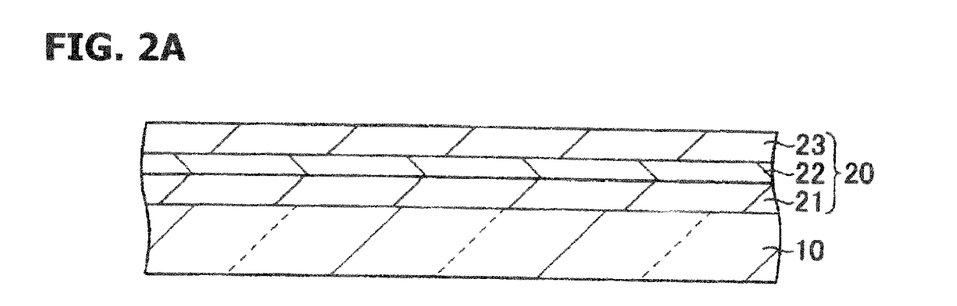
FIGS. 2A to 2C show cross sections of a laminated structure consisting of a semiconductor film etc. that illustrate the steps from the semiconductor film production step (step S201) to the growth substrate removal step (step S203).
Figure 2B:
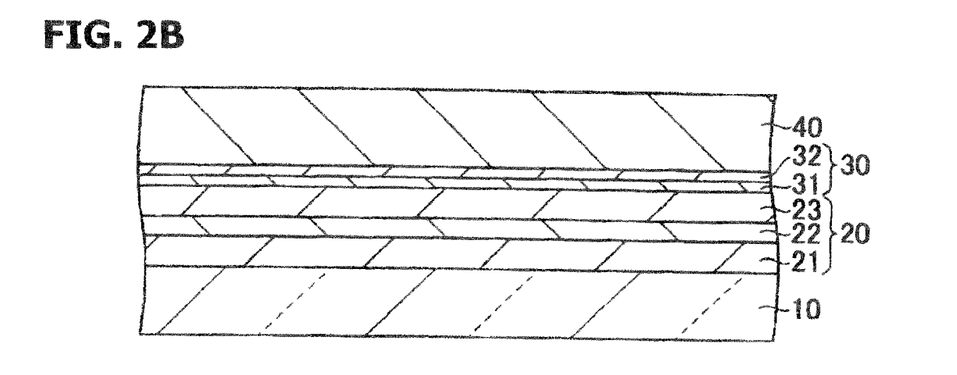
Figure 2C:
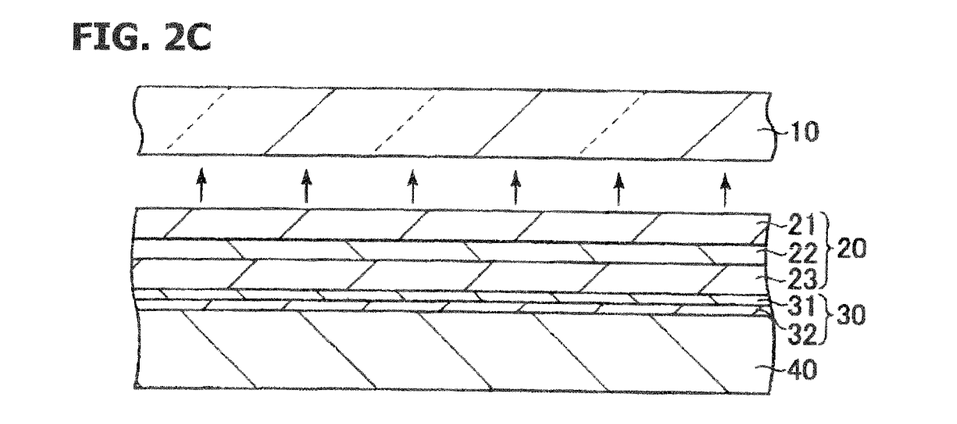

FIG. 2A to 2C show cross sections of a laminated structure consisting of a semiconductor film etc. that illustrate the steps from the semiconductor film production step (step S201) to the growth substrate removal step (step S203).

The semiconductor film production step (step S201) is described below with reference to FIG. 2A. A growth substrate 10 that can serve to grow crystals of $Al_xIn_yGa_zN$ ($0 \leq x \leq 1$, $0 \leq y \leq 1$, $0 \leq z \leq 1$, $x+y+z=1$). The growth substrate may be, for instance, a c-plane sapphire substrate.

A semiconductor film 20 is produced on the growth substrate 10 by MOCVD. The semiconductor film 20 contains an n-type semiconductor layer (first semiconductor layer 21), an active layer 22, and a p-type semiconductor layer (second semiconductor layer 23), each constituted of $Al_xIn_yGa_zN$, arranged in this order from the growth substrate 10 side.

Specifically, the growth substrate 10 is first placed in a MOCVD apparatus and heated (thermal cleaning) in a hydrogen atmosphere at 1,000° C. for 10 minutes. Then, at about 500° C., 10.4 μmol/min of TMG (trimethylgallium) and $NH_3$ 3.3 LM are supplied for 3 minutes to produce a low temperature buffer layer. Subsequently, it was heated up to 1,000° C. and held at the temperature for 30 seconds to crystallize the low temperature buffer layer, and while maintaining the temperature, 45 μmol/min of TMG and $NH_3$ 4.4 LM are supplied for 20 minutes to produce a GaN base layer with a thickness of about 1 μm. Then, at 1,000° C., 45 μmol/min of TMG, $NH_3$ 4.4 LM, and $2.7 \times 10^{-9}$ μmol/min of $SiH_4$ (monosilane) are supplied for 120 minutes to grow an n-GaN layer (n-type first semiconductor layer 21) up to a thickness of about 7 μm.

The active layer 22 has an InGaN/GaN multiple quantum well structure. In the Embodiment, 5 periods of InGaN/GaN were grown. At about 700° C., a cycle of supplying 3.6 μmol/min of TMG, 10 μmol/min of TMI (trimethylindium), and $NH_3$ 4.4 LM for 33 seconds to grow an InGaN well layer with a film thickness of about 2.2 nm, and supplying 3.6 μmol/min of TMG and $NH_3$ 4.4 LM for 320 seconds to grow a GaN barrier layer with a film thickness of about 15 nm was repeated five times.

The temperature was raised to 870° C., and 8.1 μmol/min of TMG, 7.5 μmol/min of TMA (trimethylaluminum), $NH_3$ 4.4 LM, and $2.9 \times 10^{-7}$ μmol/min of $Cp_2Mg$ (bis(cyclopentadienyl)magnesium) were supplied for 5 minutes to grow a p-AlGaN clad layer up to a thickness of about 40 nm. While maintaining the temperature, 18 μmol/min of TMG, $NH_3$ 4.4 LM, and $2.9 \times 10^{-7}$ μmol/min of $Cp_2Mg$ were supplied for 7 minutes to grow a p-GaN layer (p-type second semiconductor layer 23) up to a thickness of about 150 nm.

The support production step (step S202) is described below with reference to FIG. 2B. First, in this step, a p-electrode 31 and part of a joining layer 32 used for joining with the support are produced on the surface of a second semiconductor layer 23 which is a p-GaN layer. Specifically, layers of Pt of 10 Å, Ag of 1,500 Å, Ti of 1,000 Å, Pt of 1,000 Å, Ti of 250 Å, W of 1,000 Å, Ti of 250 Å, Pt of 100 Å, and Au of 2,000 Å were produced by electron beam deposition in this order from the second semiconductor layer 23 side. These not only have the function to join with a support, but also have a laminated structure that meets requirements relating to contact with a second semiconductor layer 23, ohmic property, reflectance for light emitted in the active layer 22, prevention of diffusion of constituent metals out of the layers, and in particular, prevention of their entering into the semiconductor film 20.

In separate operations, an electrode layer is prepared on the surface of a silicon substrate to maintain ohmic contact with said silicon substrate, along with a support 40 that carries part of a joining layer 32 used for joining with the semiconductor film. Specifically layers of Pt of 2,000 Å, Ti of 15,000 Å, Ni of 5,000 Å, Au of 1,000 Å, Pt of 2,000 Å, and AuSn of 10,000 Å were produced in this order on an electrically conductive silicon wafer that contained impurities. Subsequently, while holding the part of the joining layer 32 on the semiconductor film 20 and the other part of the joining layer 32 on the support 40 held opposite to each other, the semiconductor film 20 and the support 40 were combined strongly, with the metal layer 30 that consisted of a joining layer 32 and a p-electrode 31 sandwiched between them, followed by thermocompression bonding in a nitrogen atmosphere to unite the semiconductor film 20 and the support 40 through AuSn eutectic bonding.

Here, a metal joining layer used to join the semiconductor film 20 and the support 40 may be formed as required on the semiconductor film 20 and/or the support 40 during a step prior to their joining, and it may have other functions than joining as required.

The growth substrate removal step (step S203) shown in FIG. 2C is then carried out. The growth substrate 10 is removed by laser lift-off in this growth substrate removal step.

The growth substrate removal step is described in detail below with reference to FIGS. 3A to 7.

Figure 3A:
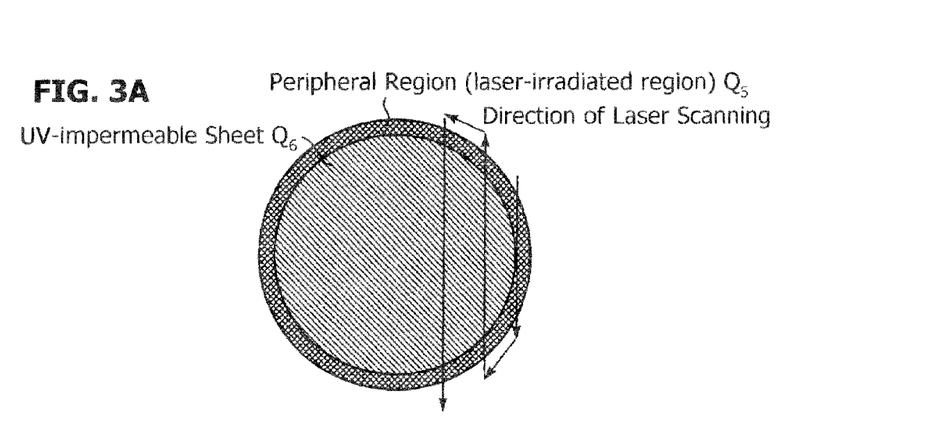
FIGS. 3A to 3C schematically show the first step of the growth substrate removal.
Figure 3B:
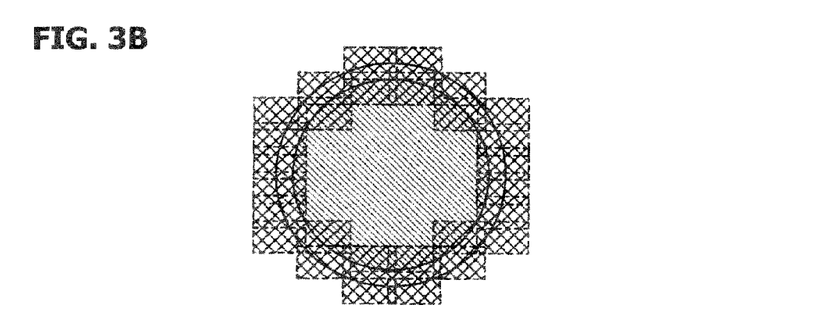
Figure 3C:
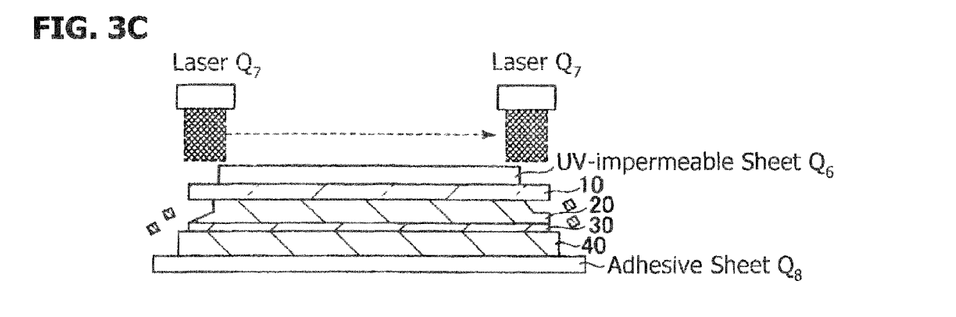

FIG. 3A to 3C schematically shows the first step of the growth substrate removal. See FIG. 3A. In the first step, a pulsed laser beam is applied to the peripheral region $Q_5$ of the growth substrate 10 (peripheral region $Q_5$ of the wafer) from the growth substrate 10 side. For instance, the non-peripheral region of the growth substrate 10 is covered with a UV-impermeable sheet $Q_6$ that does not permeate ultraviolet light, and a pulsed laser beam, such as KrF excimer laser (wavelength 248 nm), is applied to scan the wafer across its plane. In FIG. 3A, the laser scanning directions are schematically shown by arrows. In the present Embodiment, a disk-like UV-impermeable sheet with a smaller radius than that of the growth substrate 10 was attached in the central region of the growth substrate 10, and a laser was applied over the entire face of the wafer.

It is preferable that the peripheral region to be irradiated with a laser beam has a width of 3 mm or more as measured from the circumference of the growth substrate toward its center. If it is less than 3 mm from the circumference, the growth substrate 10 and the semiconductor film 20 will remain bonded strongly even in the second step of growth substrate removal, making it difficult to peel and remove the growth substrate 10.

It is preferable that the peripheral region to be irradiated with a laser beam has a width of 5 mm or less as measured from the circumference of the growth substrate. If a region more than 5 mm away from the circumference is irradiated with a laser beam in the first step, the number of semiconductor light emitting devices produced from one wafer will decrease, leading to cost problems.

FIG. 3B shows a part of a region irradiated with a laser pulse. The laser pulse is shaped to have, for instance, a rectangular cross section before irradiating the wafer. Scanning is performed in the short side direction of the rectangular irradiation regions (vertical direction in the figure) and in their long side direction (horizontal direction in the figure). The energy density at the beam-irradiated surface was adjusted to 950 $mJ/cm^2$. It is preferable that the energy density of the laser beam used for irradiation is in an appropriate range, such as 940 $mJ/cm^2$ or more and 970 $mJ/cm^2$ or less, to ensure complete decomposition of the semiconductor film 20 (first semiconductor layer 21, which is an n-GaN layer). If the energy density is lower than this, the semiconductor film 20 will not be decomposed sufficiently in the in peripheral region, possibly leaving the growth substrate 10 and the semiconductor film 20 bonded strongly and difficult to peel off. If the energy density is higher than this, on the other hand, cracks can take place in non-peripheral regions (outside the laser irradiated region) of the semiconductor film 20, causing a decrease in the yield.

In carrying out pulsed laser beam irradiation, the edges of the beam irradiated regions should overlap each other to ensure that unirradiated regions will not be left in the peripheral region. The laser beam is applied over the entire peripheral region. The width of the overlaps is, for instance, 10 µm.

See FIG. 3C. The semiconductor film 20 is decomposed as a result of the irradiation with a laser beam $Q_7$ in the first step, causing the peripheral region of the growth substrate 10 to be peeled off from the semiconductor film 20. Here, the wafer is fixed on a blue sheet $Q_8$ etc. during the laser beam irradiation.

Figure 4A:
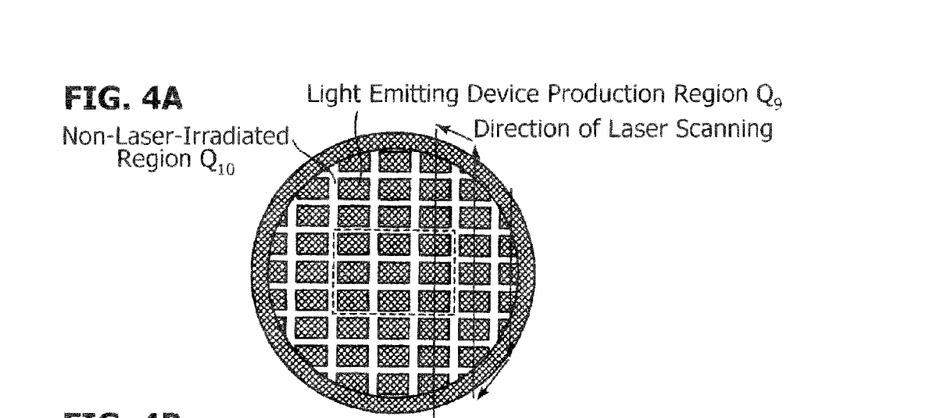
FIG. 4A to 4C schematically show the second step of the growth substrate removal.
Figure 4B:
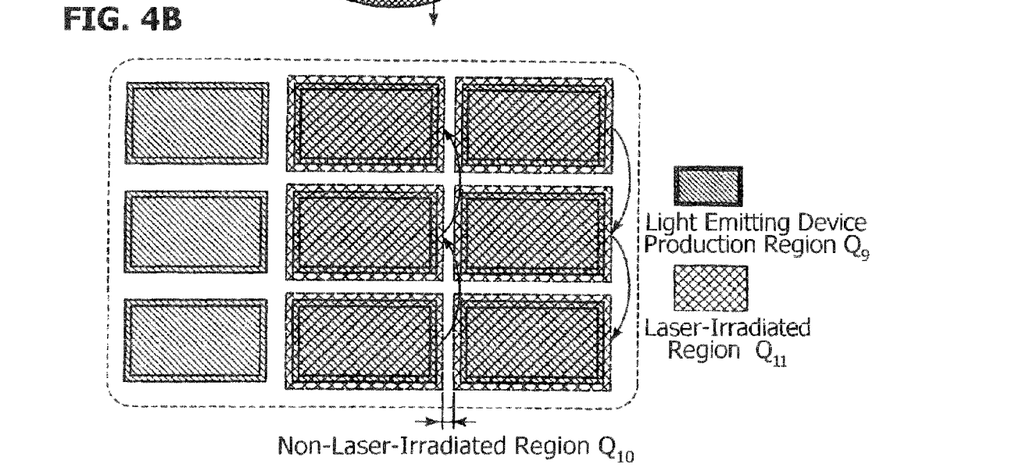
Figure 4C:
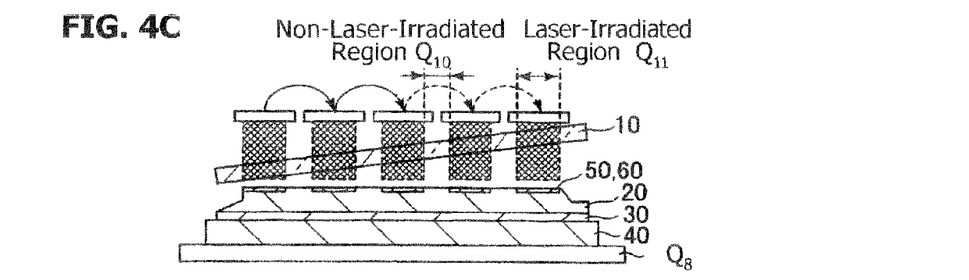

FIG. 4A to 4C schematically show the second step of the growth substrate removal. See FIG. 4A. In the second step, the UV-impermeable sheet is removed, and the region on the inner side of the peripheral region of the growth substrate 10 is irradiated with a pulsed laser beam from the growth substrate 10 side. Only the inner region may be irradiated with a laser beam, or the entire peripheral region may be irradiated with a laser beam.

For instance, a rectangularly shaped KrF excimer laser (wavelength 248 nm) is applied by scanning across the plane of the wafer. Scanning is performed in the short side direction of the rectangular irradiation regions (vertical direction in the figure) and in their long side direction (horizontal direction in the figure). In FIG. 4A, the laser scanning directions are schematically shown by arrows. The energy density at the beam-irradiated surface was adjusted to 920 ml/cm². It is preferable that the energy density of the laser beam used for irradiation is in an appropriate range, such as 600 mJ/cm² or more and 930 mJ/cm² or less, to ensure complete peeling of the growth substrate 10 from the semiconductor film 20. If the energy density is lower than this, it will be difficult to cause the decomposition of the first semiconductor layer 71, which is an n-GaN layer, making it difficult to peel and remove the growth substrate 10. If the energy density is higher than this, on the other hand, cracks can take place in non-peripheral regions (outside the laser irradiated region) of the semiconductor film 20, causing a decrease in the yield.

Individual semiconductor light emitting device production regions $Q_9$ are irradiated separately with a pulsed laser beam. During the scanning with a pulsed laser beam, the edges of the beam irradiated regions are left non-overlapped, leaving unirradiated regions $Q_{10}$ in the growth substrate 10.

FIG. 4B shows an enlarged plan view of the region surrounded by broken lines in FIG. 4A. Each semiconductor light emitting device production region $Q_9$ is a rectangle of, for instance, 270 µm longitudinally and 480 µm laterally. A pulsed laser beam is applied over a rectangular region $Q_{11}$ of, for instance, 330 µm longitudinally and 540 µm laterally, that is slightly larger than the former. Unirradiated regions $Q_{10}$ that are not irradiated with a laser beam are left around the laser irradiated regions.

The gaps between the laser irradiated regions (width of the non-laser-irradiated regions $Q_{10}$) are 3 µm or more and 15 µm or less both in the short side direction (vertical direction in the figure) and in the long side direction (horizontal direction in the figure). If it is less than 3 µm, the wet etching will fail to start in the subsequent step (the semiconductor film removal step S204). Irregular etching may also take place. If it exceeds 15 µm, it may be impossible to peel the growth substrate 10 from the semiconductor film 20.

Figure 5:
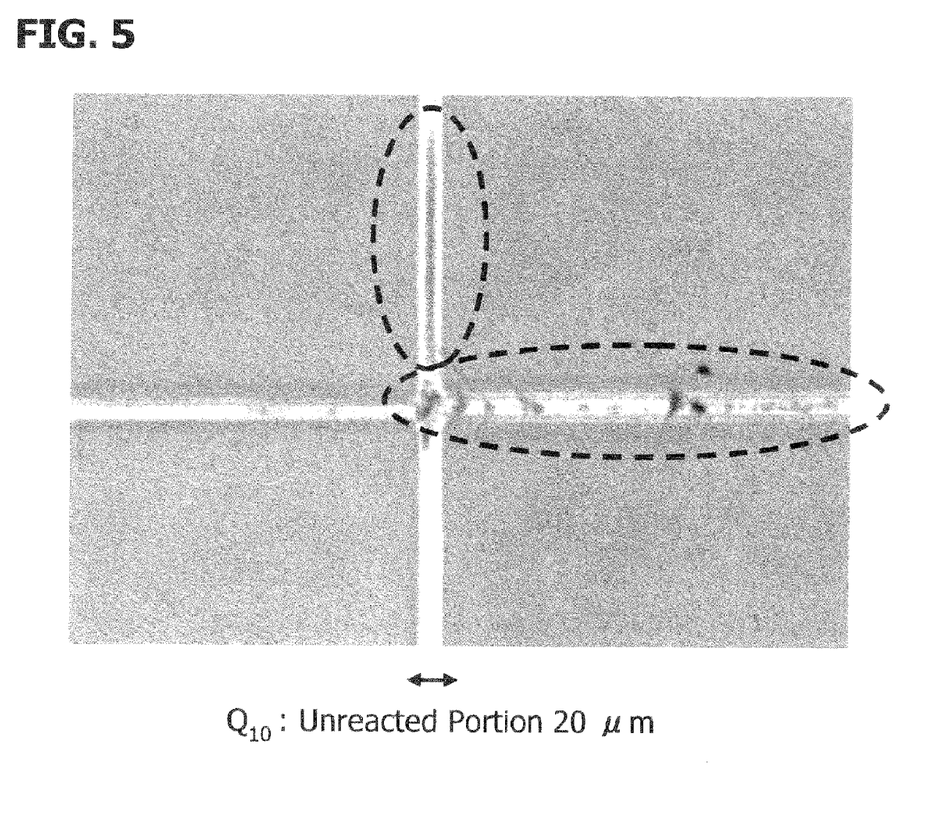
FIG. 5 shows a photograph that illustrates the semiconductor film 20 obtained after carrying out laser irradiation leaving unirradiated regions with a width of 20 μm and peeling off the growth substrate 10.

FIG. 5 shows a photograph that illustrates the semiconductor film 20 obtained after carrying out laser irradiation leaving unirradiated regions $Q_{10}$ with a width of 20 µm and peeling off the growth substrate 10. Some portions of the semiconductor film 20 in the non-laser-irradiated regions have been peeled off together with the growth substrate 10, and cracks are found in some of the remaining portions of the semiconductor film 20. In the figure, portions containing cracks are surrounded by broken lines. As seen from this, cracks etc. can take place in the semiconductor film 20 even when the growth substrate 10 and the semiconductor film 20 are peeled apart.

See FIG. 4C. The growth substrate 10 is completely peeled and removed from the semiconductor film 20 during laser irradiation in the second growth substrate removal step. Therefore, treatment such as immersion in warm water of above 30° C., which is the melting point of Ga, is not necessary for the separation of the growth substrate 10 and to the semiconductor film 20.

Figure 6A:
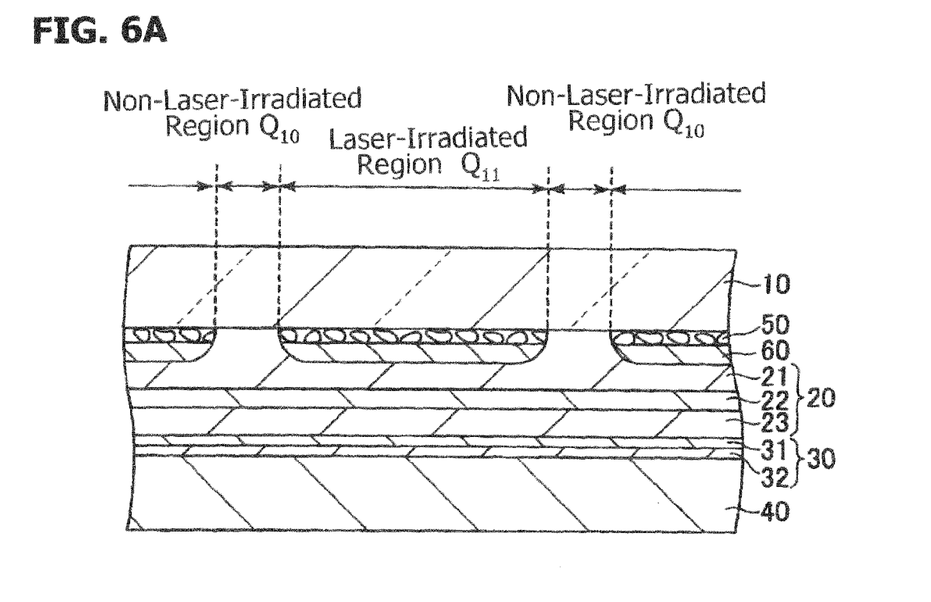
FIGS. 6A and 6B schematically show cross sections that illustrate the laminated structure (wafer) consisting of a semiconductor film etc. irradiated with a laser beam in the second growth substrate removal step.
Figure 6B:
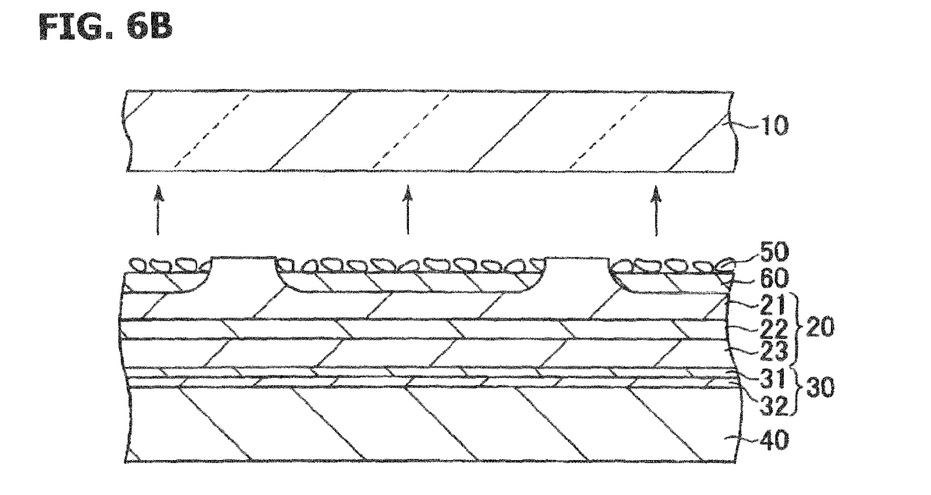

FIGS. 6A and 6B schematically show cross sections that illustrate the laminated structure (wafer) consisting of a semiconductor film etc. irradiated with a laser beam in the second growth substrate removal step.

As shown in FIG. 6A, the surface of the semiconductor film 20 (first semiconductor layer 21 produce of n-GaN) in the laser irradiated regions $Q_{11}$ (regions where semiconductor light emitting devices are to be produced) is decomposed, and the metal Ga layer 50 and the laser-altered layer 60 are produced. The semiconductor film 20 is not decomposed in those regions $Q_{10}$ that are not irradiated with a laser beam.

See FIG. 6B. It is considered that the peeling of the growth substrate 10 from the semiconductor film 20 under laser irradiation in the second step is caused by a force resulting from the pressure (volume expansion) of $N_2$ gas released under laser irradiation and the differences in the coefficient of thermal expansion etc. among the various materials that constitute the support 40, the semiconductor film 20, and the growth substrate 10, which can act to peel the growth substrate 10 in the laser irradiated regions and non-laser-irradiated regions from the semiconductor film 20. Little amount of metal Ga is separated out, leading to a weaker bonding between the growth substrate 10 and the semiconductor film 20, which may also be a factor in this.

If the growth substrate 10 in the peripheral region is not peeled off by laser irradiation in the first step, there will be no outlets for the $N_2$ gas, possibly leading to cracks in the semiconductor film 20. To provide outlets for the $N_2$ gas effectively, it is preferable that the laser irradiation in the second step is started with the edge of the wafer as indicated by arrows FIG. 4A.

Even if the growth substrate 10 is not peeled by laser irradiation in the second step, its peeling can be easily achieved by carrying out heating, cooling, or application of supersonic waves, external force, etc.

With respect to comparison between the first step and the second step of growth substrate removal, it is preferable that the energy density of the laser beam used for irradiation is higher in the first step. This is because previous studies of the present inventors have shown that the separation between the growth substrate 10 and the semiconductor film 20 is more difficult in the peripheral region than in the inner region. It is inferred that the difficulty in the separation in the peripheral region arises from an increase in the bonding strength between the growth substrate 10 and the semiconductor film 20 that results from the following facts: (i) Metal material squeezed out during the eutectic bonding (thermocompression bonding) between the semiconductor film 20 and the support 40 in the support production step (step S202) remain on the wafer, (ii) Crystal growth is relatively difficult in the peripheral region, and the surface of the semiconductor film 20 in the peripheral region is less even and has a larger area than in the inner region, and (iii) The crystal growth sometimes cannot proceed normally in the peripheral region, and if the semiconductor film 20 produced has a Ga-rich inadequate composition, a large amount of Ga is separated out under laser irradiation.

In the Embodiment, a laser beam with a relatively strong energy is applied to the peripheral region in the first growth substrate removal step to decompose the semiconductor film 20, sometimes making it difficult to produce semiconductor light emitting devices with a high yield from the peripheral region. However, in the peripheral region with a width of, for instance, about 3 mm from the circumference in the growth substrate 10, other steps such as stable crystal growth and electrode production are difficult, and it is essentially impossible to achieve high-yield production of semiconductor light emitting devices. In the Embodiment, therefore, laser irradiation in the first step was performed with a higher energy density than in the second step, to allow the semiconductor film 20 to be decomposed adequately in the peripheral region and ensure the peeling of the growth substrate 10.

Figure 7:
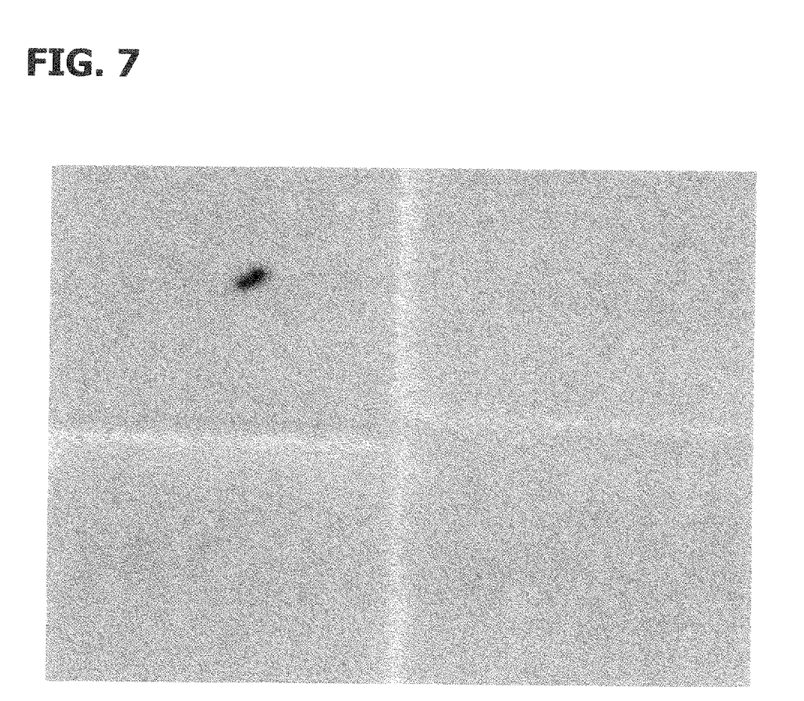
FIG. 7 shows a photograph that illustrates the semiconductor film 20 obtained after peeling off the growth substrate 10 in the growth substrate removal step (step S203).

FIG. 7 shows a photograph that illustrates the semiconductor film 20 obtained after peeling off the growth substrate 10 in the growth substrate removal step (step S203). Unlike the photograph shown in FIG. 5, there are no cracks generated.

Figure 8A:
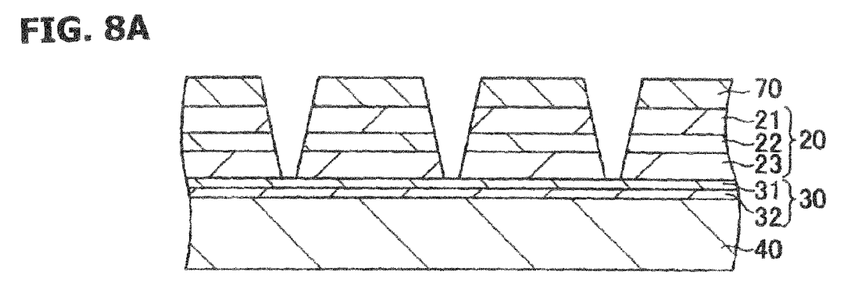
FIG. 8A to 8C schematically show cross sections of the laminated structure consisting of a semiconductor film etc. that illustrate the steps from the semiconductor film removal step (step S204) to the device separation step (step S206).
Figure 8B:
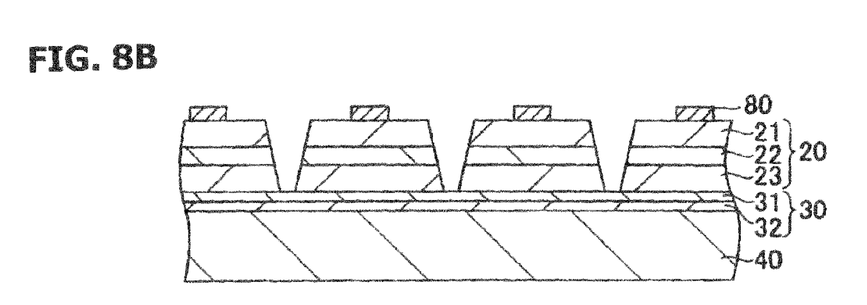
Figure 8C:
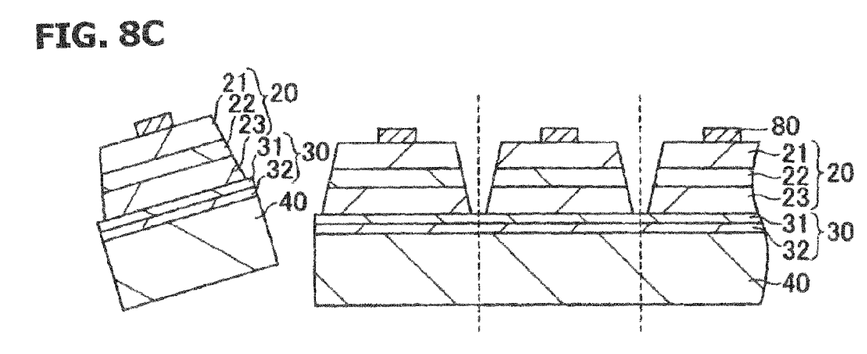

FIGS. 8A to 8C schematically show cross sections of the laminated structure consisting of a semiconductor film etc. that illustrate the steps from the semiconductor film removal step (step S204) to the device separation step (step S206).

The semiconductor film removal step (step S204) is described below with reference to FIG. 8A. First, in the semiconductor film removal step, a photoresist is left in the region where the film is to be removed (streets) in the semiconductor film 20. Then, electron beam deposition is carried out to produce a Ni film with a thickness of 10 Å and an Ag film with a thickness of 3,000 Å in this order on the photoresist and the semiconductor film 20. Subsequently, the resist and the film on the resist are removed by the lift-off technique to produce a Ni/Ag etching mask 70. In addition, the wafer is immersed in TMAH to remove those portions of the semiconductor film 20 that are free from the etching mask 70 so that individual semiconductor light emitting devices are isolated.

When the wafer is immersed in TMAH, etching starts in the non-laser-irradiated region (the region where the surface of the semiconductor film 20 is exposed as shown in FIG. 6B). This is because the non-laser-irradiated region is free from a metal Ga layer 50 that impedes etching or an altered layer 60 affected by laser irradiation. Implementation of laser irradiation while leaving unirradiated regions in the second step of growth substrate removal (step S203) makes it possible to remove the semiconductor film 20 without irregular etching or uniformly.

As described above, non-laser-irradiated regions with a width of 3 µm or more are necessary to allow initial etching to start. If the non-laser-irradiated region has a width of, for instance, 20 µm, the peeling of the growth substrate cannot be achieved smoothly during laser irradiation in the second step of growth substrate removal. In cases where the growth substrate 10 and part of the semiconductor film 20 are bonded partially in some unirradiated portions, forced separation of the growth substrate will cause cracks running from unirradiated portions to semiconductor light emitting device regions, working strongly to cause a decrease in the yield. If cracks take place in the semiconductor film 20 in the growth substrate removal step, it will sometimes be impossible to etch the portions around the cracks in the semiconductor layer. In cases where the growth substrate 10 and part of the semiconductor film 20 are bonded partially in some unirradiated portions, forced separation of the growth substrate in the growth substrate removal step will sometimes cause some portions separated from the semiconductor film 70 to be left adhered on the growth substrate 10, making it impossible to achieve uniform etching (removal of semiconductor film) in the semiconductor film removal step.

Figure 9A:
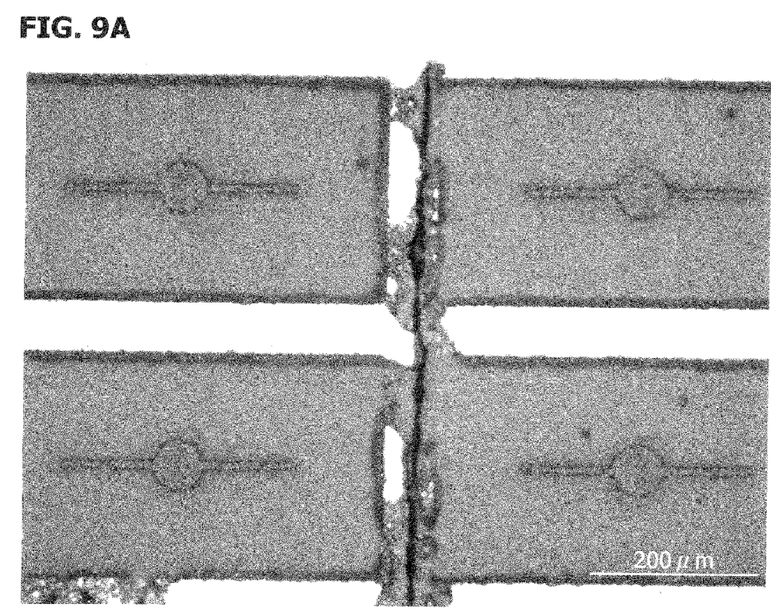
FIGS. 9A and 9B show photographs that illustrate the processed conditions after the semiconductor film removal step.
Figure 9B:
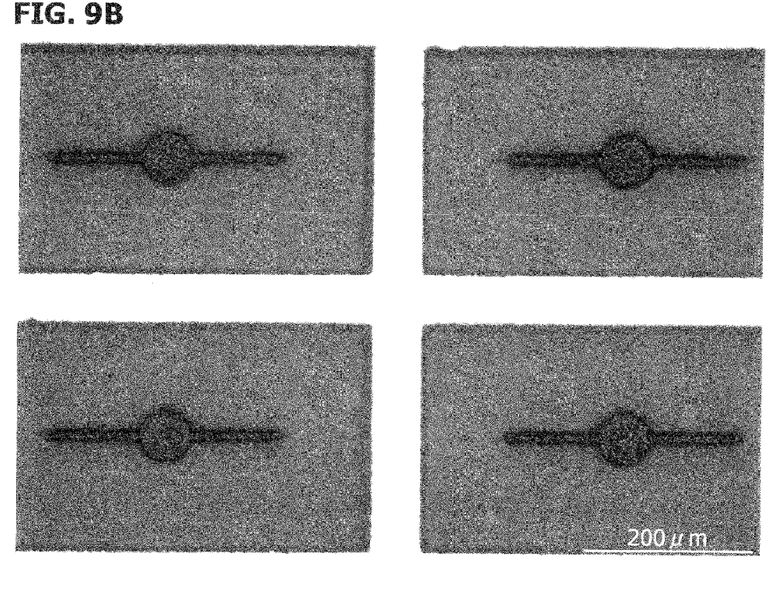

FIGS. 9A and 9B show photographs that illustrate the processed conditions after the semiconductor film removal step. FIG. 9A depicts conditions of a sample containing a cracked semiconductor film 20 after undergoing etching treatment, while FIG. 9B shows conditions of a crack-free sample.

See FIG. 9A. In the sample containing a cracked semiconductor film 20, some portions around the cracks in the semiconductor layer are left unetched. This is considered to arise from metal Ga diffusing through these cracks and adhering to the semiconductor film 20.

See FIG. 9B. In the crack-free samples, the portions of the semiconductor film 20 at the predetermined positions have been removed by etching, and individual semiconductor light emitting device regions have been clearly isolated.

TMAH is use in the Embodiment to etch the semiconductor film 20 in the semiconductor film removal step (step S204), but instead, wet etching may be performed using an alkali solution such as KOH that serves for etching of the c-plane of GaN.

Here, Ga is a metal that has a very low melting point of 30° C. Accordingly, Ga separated out on the surface of the semiconductor light emitting device production regions may dissolve in the photoresist or developer during operations such as baking and development performed for photoresist formation in this step, or may come off by itself during common operation for washing the wafer.

The electrode production step (step S205) is described below with reference to FIG. 8B. In electrode production step, n-electrodes 80 are produced on the surface of the first semiconductor layer 21 which is an n-GaN layer. The removal of the etching mask 70 is followed by spreading and patterning of a photoresist, formation of metal films by electron beam deposition, and removal of the photoresist to produce n-electrodes 80 consisting of laminated Ti, Pt, and Au of 250 Å, 1,000 Å, and 8,000 Å, respectively, at predetermined positions. As light emitting in the active layer 22 will be released through the first semiconductor layer 21, it is preferable that the n-electrodes 80 formed have at least a minimum area required for wire bonding to be performed to mount the semiconductor light emitting devices for practical uses.

Here, in order to increase the light extraction efficiency of the semiconductor light emitting devices, this step may be either preceded or followed by a step of treating the exposed surface of the first semiconductor layer 21 with an alkali solution such as KOH to produce irregularities on the surface.

The device separation step (step S206) is described below with reference to FIG. 8C. In the device separation step, the metal layer 30 and the support 40 are cut by dicing into individual semiconductor light emitting devices. Instead of dicing, other methods such as point scribing/breaking and laser scribing may be used for the cutting.

The semiconductor light emitting device production method of the Embodiment has characteristic features in the growth substrate removal step (step S203). First, in the first step, the peripheral region of the growth substrate 10 is irradiated with a laser beam with a relatively high energy density, and the growth substrate 10 and the semiconductor film 20 are separated in the peripheral region. This serves to use a laser beam with a relatively low energy density to irradiate the individual semiconductor light emitting device regions in, for instance, the second step to reduce defects arising from cracks etc.

In the second step, laser irradiation is carried out while leaving some unirradiated regions. For instance, the growth substrate 10 can be peeled off without producing a metal Ga layer 50 or an altered layer 60 in the regions where the semiconductor film 20 is removed in the semiconductor film removal step (step S204), and consequently, it is possible to eliminate the post-treatment steps before producing streets by wet etching. In addition, wet etching of the semiconductor film 20 can be conducted over the entire face of the wafer at a constant etching rate.

Thus, the semiconductor light emitting device production method of the Embodiment allows the growth substrate 10 to be peeled off easily and in a fewer steps. In addition, uniform production of the streets serves to improve the yield. This means that semiconductor light emitting devices can be produced with high production efficiency.

Compared with the prior art, the semiconductor light emitting device production method of the Embodiment can be carried out without introducing new equipment.

Figure 10:
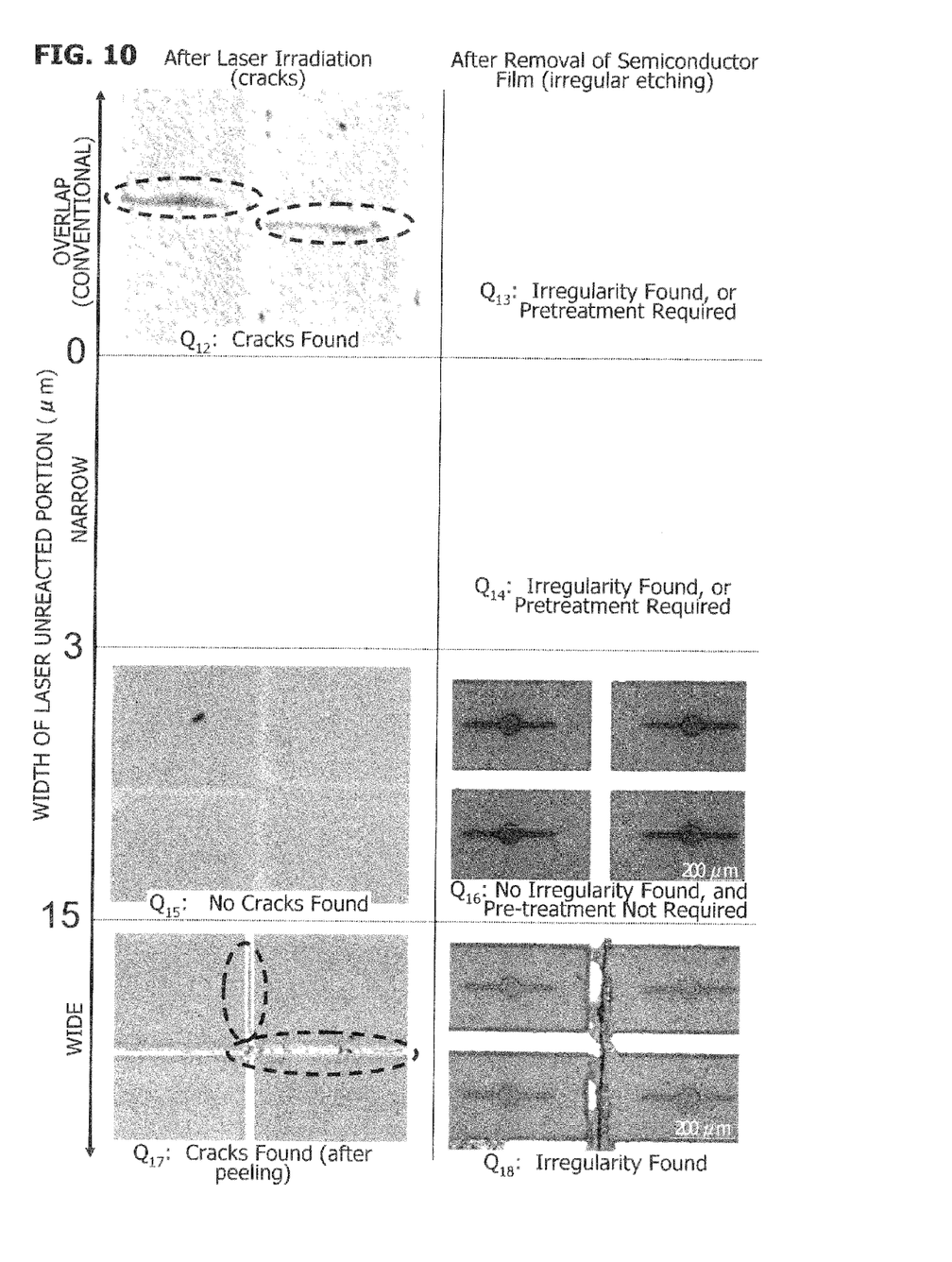
FIG. 10 shows a table that illustrates the existence/absence of cracks after laser irradiation and the existence/absence of irregular etching after removal of the semiconductor film observed at different widths of the unirradiated region.

FIG. 10 shows a table that illustrates the relation of the width of the unirradiated region with the existence/absence of cracks after laser irradiation and the existence/absence of irregular etching after removal of the semiconductor film. In FIG. 10, the vertical axis represents the width of the non-laser-irradiated region in μm. The left-hand column in the table shows the conditions (cracks) after laser irradiation, while the right-hand column shows the conditions (irregular etching) after removal of the semiconductor film.

The conventional method that requires overlapped laser beam irradiation causes both cracks and irregular etching. The area $Q_{12}$ in FIG. 10 shows a state evaluated as "cracks found," while the area $Q_{13}$ shows a state evaluated as "irregularity found, or pretreatment required." At least irregular etching takes place if the width of the non-laser-irradiated region is less than 3 μm. The area $Q_{14}$ shows a state evaluated as "irregularity found, or pretreatment required." High quality, high efficiency semiconductor light emitting devices free from cracks and irregular etching can be produced with high yield if the width of the non-laser-irradiated region is 3 μm or more and 15 μm or less. The area $Q_{15}$ shows a state evaluated as "no cracks found," while the area $Q_{16}$ shows a state evaluated as "no irregularity found, and pretreatment not required." Both cracks and irregular etching can take place simultaneously if the width of the non-laser-irradiated region exceeds 15 μm. The area $Q_{17}$ shows a state evaluated as "cracks found (after peeling)," while the area $Q_{18}$ shows a state evaluated as "irregularity found."

As seen from the table, it is preferable that in the second step of growth substrate removal (step S203), the non-laser-irradiated region has a width of 3 μm or more and 15 μm or less. This allows the growth substrate 10 to be peeled off stably without suffering cracks. It is also possible to perform wet etching stably without causing irregularities. Consequently, the yield, for instance, will increase.

Thus, the invention has been described above based on the Embodiment, though the invention is not limited to this.

For instance, in the first step of growth substrate removal (step S203) of the Embodiment, a laser beam is applied to the entire face of the wafer in which a UV-impermeable sheet is attached to the non-peripheral region of the growth substrate 10, and only the region of the semiconductor film 20 that corresponds to the peripheral region of the growth substrate 10 is decomposed and destroyed. This may be achieved by controlling the laser irradiation equipment so that only the to peripheral region is irradiated with a laser beam. Other likely methods include rotating the stage that carries the wafer or shifting it in horizontal directions so that the beam irradiated portion moves along the circumference of the wafer. Another method is to control the movement of the stage motion and the emission of the pulsed laser beam to synchronize so that only the peripheral region of the growth substrate 10 is irradiated with a laser pulse. These methods allow the semiconductor film 20 to be removed from the peripheral region of the growth substrate 10 without using a UV-impermeable sheet.

In the second step of growth substrate removal (step S203) of the Embodiment, a laser beam is applied across the wafer from its edge in reciprocatory to-and-fro motion as indicated by arrows in FIG. 4A. However, various other laser irradiation methods are available to, for instance, prevent $N_2$ gas to be trapped. As an example, those semiconductor light emitting device regions on the concentric circle with the largest radius may be irradiated first with a laser beam, followed by inner device regions. In this way, those semiconductor light emitting device regions adjacent to the regions where the growth substrate 10 and the semiconductor film 20 has already been separated, for instance, may be subjected to laser irradiation first in the second step to minimize the volume of trapped $N_2$ gas.

Furthermore, a KrF excimer laser (wavelength 248 nm) is used in the growth substrate removal step (step S203) of the Embodiment. Instead of this, an ArF excimer laser (wavelength 193 nm), Nd:YAG laser's third harmonic (wavelength 354 nm), or fourth harmonic (wavelength 266 nm) may be used. A laser beam in a wavelength of 150 nm or more and 400 nm or less may be used preferably.

In the Embodiment, moreover, an n-type GaN layer is used as the first semiconductor layer 21 of the semiconductor film 20, a five-period InGaN/GaN multiple quantum well structure as the active layer 22, and a p-type GaN layer as the second semiconductor layer 23, but these may be generally constituted of $Al_xIn_yGa_zN$ ($0 \leq x \leq 1$, $0 \leq y \leq 1$, $0 \leq z \leq 1$, $x+y+z=1$).

In addition, an electrically conductive silicon wafer is adopted as the support 40 in the Embodiment, but a Ge substrate or a metal substrate of Cu, for instance, may be used by an appropriate method.

Other various changes, improvements, and combinations may also useful as is well known to those skilled in the art.

This invention is applicable to production of various semiconductor light emitting devices.

What we claim are:

1. A semiconductor light emitting device production method comprising:
   (a) a step of preparing a growth substrate,
   (b) a step of producing a semiconductor film containing a first semiconductor layer of a first electrical conduction type, an active layer, and a second semiconductor layer of a second electrical conduction type, each represented as $Al_xIn_yGa_zN$ ($0 \leq x \leq 1$, $0 \leq y \leq 1$, $0 \leq z \leq 1$, $x+y+z=1$), on said growth substrate, said layers arranged in this order from the growth substrate side,
   (c) a step of preparing a support,
   (d) a step of producing a metal layer on at least one of said semiconductor film and said support and joining said semiconductor film and said support with said metal layer sandwiched thereinbetween, (e) a step of irradiating the peripheral region of said growth substrate with a laser beam to separate said growth substrate from said semiconductor film in said peripheral region, (f) a step of irradiating portions on the inner side of the peripheral region of said growth substrate with a laser beam, while leaving unirradiated portions, to separate and remove said growth substrate from said semiconductor film, and (g) a step of removing portions of said semiconductor film where said growth substrate has already been separated and removed, to set up regions where semiconductor light emitting devices are to be produced, wherein a laser beam with a first energy density is applied in said step (e), and a laser beam with a second energy density that is lower than said first energy density is applied in said step (f).

2. The semiconductor light emitting device production method as claimed in claim 1, wherein portions surrounding said regions where semiconductor light emitting devices are to be produced are irradiated with a laser beam while providing said unirradiated portions with a width of 3 μm or more and 15 μm or less around said irradiated portions in said step (f).

3. The semiconductor light emitting device production method as claimed in claim 1, wherein said first energy density is 940 mJ/cm$^2$ or more and 970 mJ/cm$^2$ or less, and said second energy density is 600 mJ/cm$^2$ or more and 930 mJ/cm$^2$ or less.

4. The semiconductor light emitting device production method as claimed in claim 1, wherein said unirradiated regions are not left in the peripheral region of said growth substrate when laser irradiation is performed in said step (e).

5. The semiconductor light emitting device production method as claimed in claim 1, wherein said growth substrate prepared in said step (a) is a sapphire substrate.

6. A semiconductor light emitting device production method as comprising:

(a) a step of preparing a growth substrate, (b) a step of producing a semiconductor film containing a first semiconductor layer of a first electrical conduction type, an active layer, and a second semiconductor layer of a second electrical conduction type, each represented as $Al_xIn_yGa_zN$ ($0 \leq x \leq 1$, $0 \leq y \leq 1$, $0 \leq z \leq 1$, $x+y+z=1$), on said growth substrate, said layers arranged in this order from the growth substrate side, (c) a step of preparing a support, (d) a step of producing a metal layer on at least one of said semiconductor film and said support and joining said semiconductor film and said support with said metal layer sandwiched thereinbetween, (e) a step of irradiating the peripheral region of said growth substrate with a laser beam to separate said growth substrate from said semiconductor film in said peripheral region, (f) a step of irradiating portions on the inner side of the peripheral region of said growth substrate with a laser beam, while leaving unirradiated portions, to separate and remove said growth substrate from said semiconductor film, and (g) a step of removing portions of said semiconductor film where said growth substrate has already been separated and removed, to set up regions where semiconductor light emitting devices are to be produced, wherein the portions surrounding said regions where semiconductor light emitting devices are to be produced that are adjacent to said peripheral region of the growth substrate are irradiated first with a laser beam in said step (f).

* * * * *